(12) United States Patent
Ahrens et al.

(10) Patent No.: US 10,352,994 B2
(45) Date of Patent: Jul. 16, 2019

(54) MAGNET AND ADAPTER ASSEMBLY FOR MOUNTING ON A SHAFT END OF AN ELECTRIC DRIVE

(71) Applicant: Bühler Motor GmbH, Nürnberg (DE)

(72) Inventors: Matthias Ahrens, Nürnberg (DE); Georg Bernreuther, Nürnberg (DE); Olaf Richter, Stein (DE); Andreas Wall, Nürnberg (DE)

(73) Assignee: BÜHLER MOTOR GMBH, Nürnberg (DE)

( * ) Notice: Subject to any disclaimer, the term of this patent is extended or adjusted under 35 U.S.C. 154(b) by 0 days.

(21) Appl. No.: 15/717,049

(22) Filed: Sep. 27, 2017

(65) Prior Publication Data

US 2018/0031628 A1 Feb. 1, 2018

Related U.S. Application Data

(63) Continuation of application No. PCT/DE2016/200157, filed on Mar. 23, 2016.

(30) Foreign Application Priority Data

Apr. 2, 2015 (DE) .................. 10 2015 206 108

(51) Int. Cl.
*G01R 31/28* (2006.01)
*H02K 29/08* (2006.01)
(Continued)

(52) U.S. Cl.
CPC ........... *G01R 31/2884* (2013.01); *H01F 1/01* (2013.01); *H02K 11/215* (2016.01); *H02K 29/08* (2013.01); *H02K 7/003* (2013.01); *H02K 7/08* (2013.01)

(58) Field of Classification Search
CPC ..... G01R 31/2884; H01F 1/01; H02K 11/215; H02K 29/08; H02K 7/003; H02K 7/08; G01B 7/30; G01D 5/145; G01D 5/142
See application file for complete search history.

(56) References Cited

U.S. PATENT DOCUMENTS

| 5,544,000 A * | 8/1996 | Suzuki | F02D 11/106 324/207.2 |
| 2002/0171416 A1* | 11/2002 | Schroeder | G01D 5/145 324/207.21 |

(Continued)

FOREIGN PATENT DOCUMENTS

| DE | 199 05 274 A1 | 8/2000 |
| DE | 10 2006 032 780 A1 | 1/2008 |

(Continued)

OTHER PUBLICATIONS

International Search Report dated Jul. 22, 2016, issued in counterpart International Application No. PCT/DE2016/200157, w/English translation (13 pages).

(Continued)

*Primary Examiner* — Jay Patidar
(74) *Attorney, Agent, or Firm* — Westerman, Hattori, Daniels & Adrian, LLP

(57) ABSTRACT

A magnet assembly in an electric drive having a shaft. The assembly includes a permanent magnet bonded in plastic and having two protrusions. An adapter has two protrusions and two recesses. The end face of the shaft has two cavities, which receive the two adapter protrusions to mount the adapter to the shaft. The two protrusions of the magnet are received in the recesses in the adapter in order to mount the magnet to the adapter. In another embodiment the shaft has an outer circumferential surface. Here, the adapter has a recess of a first shape and a second recess for mounting the adapter onto the outer circumferential surface of the shaft (Continued)

and the permanent magnet has a protrusion shaped to mate with the first shape of the first recess in the adapter, and the first recess is configured to receive the protrusion to mount the magnet to the adapter.

5 Claims, 3 Drawing Sheets

(51) Int. Cl.
*H02K 11/215* (2016.01)
*H01F 1/01* (2006.01)
*H02K 7/00* (2006.01)
*H02K 7/08* (2006.01)

(56) References Cited

U.S. PATENT DOCUMENTS

| | | | | |
|---|---|---|---|---|
| 2004/0164729 | A1* | 8/2004 | Ikeda | G01D 5/145 |
| | | | | 324/207.21 |
| 2007/0090829 | A1* | 4/2007 | Kurita | F02D 9/105 |
| | | | | 324/207.25 |
| 2009/0072816 | A1* | 3/2009 | Schrubbe | G01D 5/06 |
| | | | | 324/207.2 |
| 2012/0176126 | A1* | 7/2012 | Naganuma | G01R 33/0011 |
| | | | | 324/207.25 |
| 2014/0015384 | A1* | 1/2014 | Someya | G01D 5/2454 |
| | | | | 310/68 B |
| 2014/0070799 | A1* | 3/2014 | Taniguchi | G01D 5/145 |
| | | | | 324/207.25 |
| 2014/0368192 | A1* | 12/2014 | Kaneko | G01D 5/145 |
| | | | | 324/207.25 |
| 2016/0141940 | A1* | 5/2016 | Hager | G01P 3/487 |
| | | | | 403/341 |

FOREIGN PATENT DOCUMENTS

| | | |
|---|---|---|
| DE | 10 2008 040318 A1 | 1/2010 |
| DE | 10 2011 079 657 A1 | 1/2013 |
| DE | 10 2012 208 368 A1 | 11/2013 |
| DE | 10 2013 217 428 A1 | 11/2014 |
| JP | 2013-7731 A | 1/2013 |
| KR | 10-2014-0120870 A | 10/2014 |
| WO | 2015/140961 A1 | 9/2015 |

OTHER PUBLICATIONS

Search Report dated May 13, 2015, issued in counterpart German Patent Application No. 10 2015 206 108.6 (8 pages).

* cited by examiner

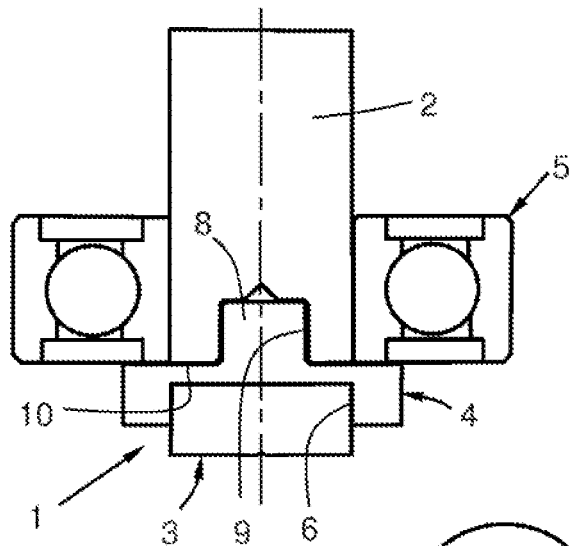
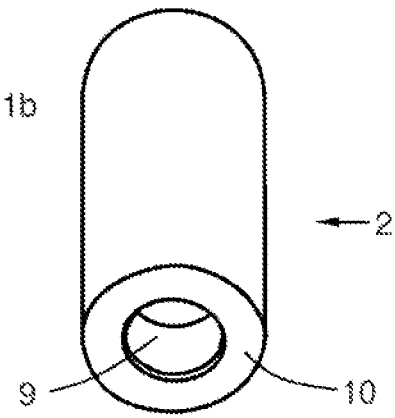
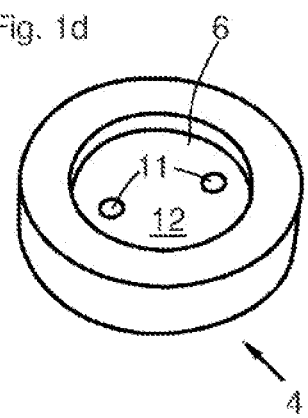
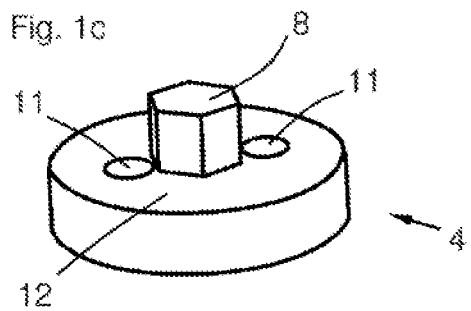
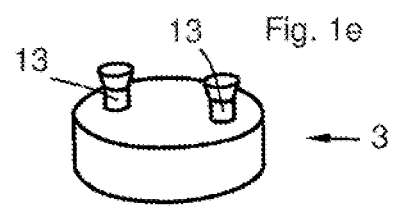

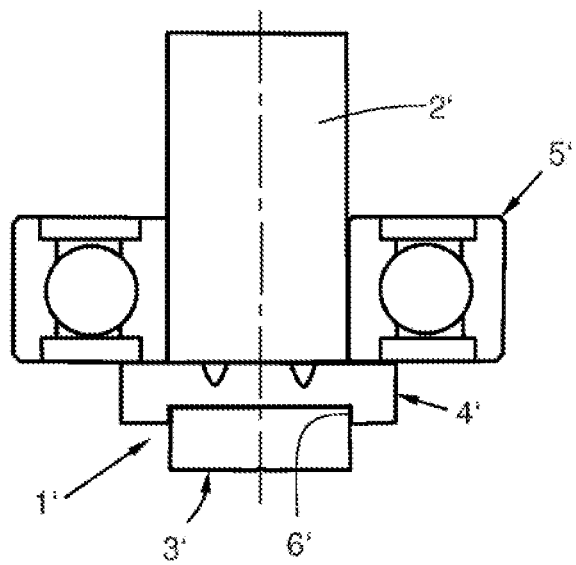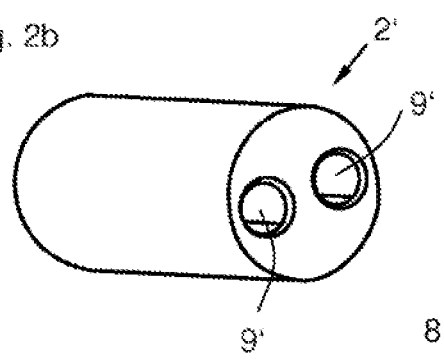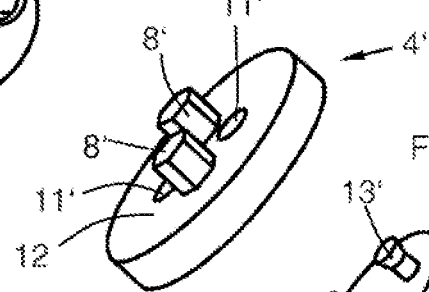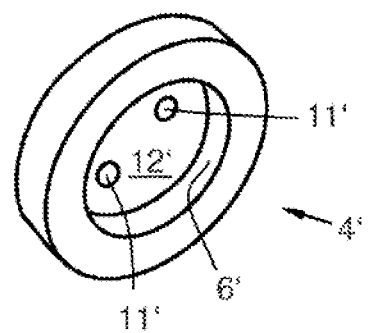

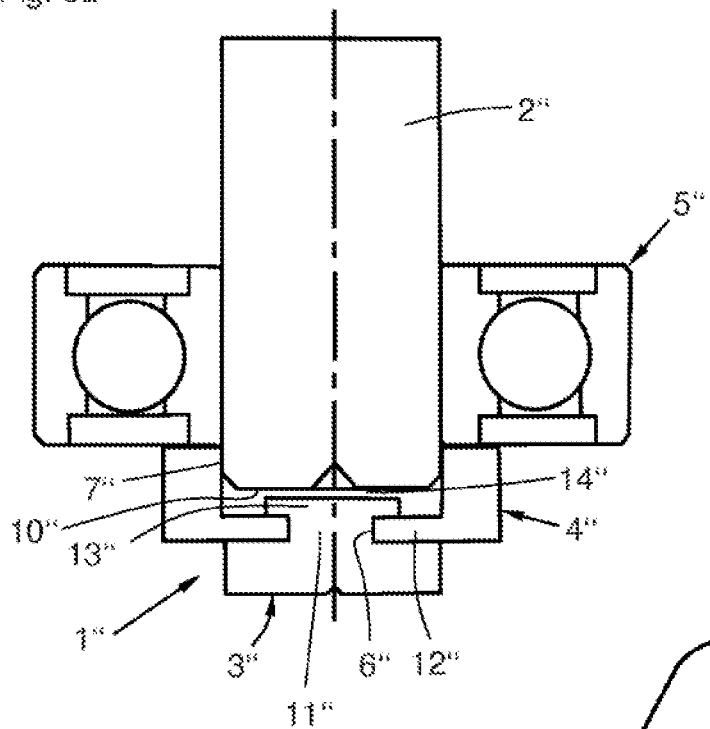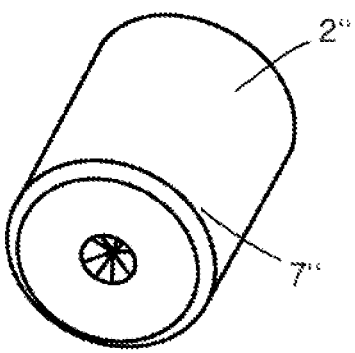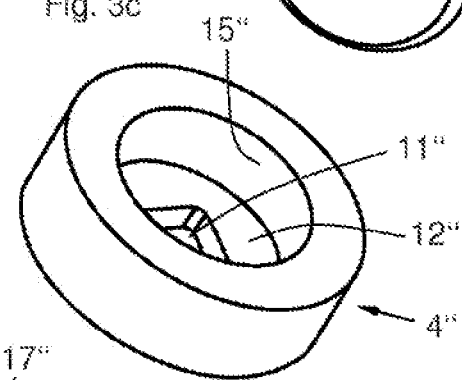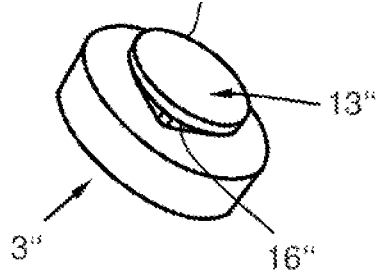

MAGNET AND ADAPTER ASSEMBLY FOR MOUNTING ON A SHAFT END OF AN ELECTRIC DRIVE

CROSS-REFERENCE TO RELATED APPLICATION

This application is a continuation application of International Application No. PCT/DE2016/200157, filed Mar. 23, 2016, which claims priority from German Application No. 10 2015 206 108.6, filed Apr. 2, 2015, the disclosures of which is incorporated herein by reference in their entireties.

BACKGROUND OF THE INVENTION

(1) Field of the Invention

The invention relates to a magnet sensor assembly that is part of an electric drive, which is mounted on an end of a shaft or an inner ring of a rolling element bearing secured to the shaft.

(2) Description of Related Art Including Information Disclosed Under 37 CFR 1.97 and 1.98

Magnet sensors are in particular used to detect the position of a permanent magnet rotor of an electronically commutated direct-current motor also known as a brushless DC motor (BLDC motor). The detection of the rotor position is a basic prerequisite for sensor-related commutation of the BLDC motor. Essential for an optimal commutation is a magnet sensor device mounted in a rotationally secure manner. It is known to connect magnet sensor assemblies to the shaft in a form-fit manner in order to ensure against rotation. This requires a not insignificant effort for the production of corresponding contours on the shaft.

In order to mount magnet sensors on shaft ends, they are often times also mounted by bonding. Bonded joints are however not suitable for harsh environmental conditions or for environments with aggressive media, such as in the case of oil pump motors, which are generally filled with oil. Adhesives frequently contain toxic, harmful substances and pollute the environment. Moreover, bonded joints are difficult to monitor and unreliable in industrial production.

Combinations of form-fit connections and bonded joints are also known, with correspondingly higher production costs.

The term "magnet sensor" refers to a small permanent magnet, which consists of at least two magnetic poles but can also have a higher number of pole pairs depending on the application. Often times, the magnet sensor is designed to be cylindrical, wherein one half forms the north pole and a second half forms the south pole. This magnet sensor is preferably magnetized axially.

BRIEF SUMMARY OF THE INVENTION

The task of the invention is to devise a magnet sensor assembly which allows as simple a connection as possible to be established between a magnet sensor and a shaft end of a shaft or an inner ring of a rolling element bearing secured to the shaft, for which simple manufacturing and mounting methods may be used which are reliable and for which a large body of experiential knowledge is available. In addition, the magnet sensor assembly should be resistant to harsh environmental conditions, including chemical resistance, vibratory strength, and large fluctuations in temperature.

Since the magnet sensor assembly consists of a magnet sensor and an adapter, the respective preferences of the materials used can be utilized. By using a plastic-bonded magnet sensor, simple connection techniques and good design possibilities can be realized. By means of a force-fit mounting of the adapter on the shaft end or inner ring, simple, proven joining methods can be used.

Particularly preferred is the use of sintering material for the adapter, because this provides a plurality of design possibilities, which can be used economically. From sintering materials can be produced very precise work pieces, which is why they are very well suited for force-fit connections. In the selection of the sintering material, non-magnetic material may be preferred in order to contribute to a high degree of efficiency of the sensor magnetic circuit.

Several possibilities of connecting the adapter to the shaft end in a force-fit manner exist. With sufficient space, a section of the outer circumference of the shaft can be used as a connecting surface. In this case, the adapter requires a relatively large installation space, because a certain minimum material thickness is also required for strength reasons. In this solution, there are no special requirements for the design of the shaft end so that a standard shaft can be used. This is of interest for economic reasons.

A second possibility consists in providing the adapter with at least one pin-like protrusion, which is pressed into a cavity in an axial end face of the shaft. In this case, installation space is generally saved, but a somewhat more elaborately designed shaft is required in return. The pin-like protrusion can have a polygonal, in particular hexagonal, or polygon-like cross section. In this way, the tolerances for the press-fit connection can be designed more economically.

By using two pin-like protrusions, which are pressed into one or two cavities in the axial end face of the shaft, a secure, rotationally secure connection can be established. When using a single cavity, the cavity can be designed in the form of a longitudinal groove.

For the connection of the adapter to the magnet sensor, a receptacle is in particular provided. This receptacle is preferably designed to be cylindrical. The magnetic material can be injected directly into such a receptacle.

Furthermore, a form fit between the magnet sensor and the adapter can be established easily. This is in particular achieved by the magnetic material of the magnet sensor filling the receptacle itself and a recess in a wall of the receptacle. The magnetic material in the recess is used in this case as an anti-rotation element if the recess is arranged eccentrically or does not have a round cross section. It is however also possible to provide two or more recesses, which are filled by the magnetic material of the magnet sensor.

In order to also ensure a form-fit connection in the axial direction, it is provided that the recess or the recesses of the wall has or have a varying cross section, wherein the cross section is larger in a region more distant from the receptacle than in a region closer to the receptacle.

Alternatively, the magnetic material of the magnet sensor can take up a space region adjacent to the wall and, in relation to the wall opposite the receptacle, which space region has a larger cross section than the recess of the wall.

The magnet sensor device can basically be pre-assembled very easily.

Particularly advantageous is the use of magnetic material of duroplast-bonded magnetic particles, because the necessity of a form fit with the sintered part can be eliminated in some circumstances as a result. Duroplast material establishes tight connections with the joining partner, wherein atomic bonds are developed. In the same way, thermoplast-bonded magnetic materials can also be used; wherein an additional form fit is required in most cases.

BRIEF DESCRIPTION OF THE SEVERAL VIEWS OF THE DRAWINGS

The invention is better understood by reading the following Detailed Description of the Preferred Embodiments with reference to the accompanying drawing figures, in which like reference numerals refer to like elements throughout, and in which:

FIG. 1a a first embodiment of the magnet sensor assembly,

FIG. 1b a three-dimensional illustration of a shaft,

FIG. 1c a three-dimensional illustration of an adapter,

FIG. 1d a three-dimensional illustration of the adapter from another perspective, FIG. 1e a three-dimensional illustration of a magnet sensor.

FIG. 2a a second embodiment of the magnet sensor assembly.

FIG. 2b a second embodiment of the shaft,

FIG. 2c a second embodiment of the adapter,

FIG. 2d an alternative illustration of the adapter from another perspective,

FIG. 2e a second embodiment of the magnet sensor,

FIG. 3a a third embodiment of the magnet sensor assembly,

FIG. 3b a third embodiment of the shaft,

FIG. 3c a third embodiment of the adapter, and

FIG. 3d a third embodiment of the magnet sensor.

Note: The reference numbers with apostrophe and the corresponding reference numbers without apostrophe refer to details with the same name in the drawings and the drawing description. This reflects use in another embodiment or the prior art, and/or the detail is a variant. The reference number list contains only reference numbers without apostrophe for the sake of simplicity.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

FIG. 1a shows a first embodiment of the magnet sensor assembly 1, which is mounted on a shaft end of a shaft 2. The magnet sensor assembly 1 consists of a magnet sensor 3 and an adapter 4. Further illustrated is a ball bearing 5, with which the shaft 2 is mounted in a drive housing not shown here. In this embodiment, the adapter 4 is provided with a receptacle 6 for the magnet sensor 3, which receptacle is designed to be substantially cylindrical. In the example shown, the magnet sensor is only partially sunk into the receptacle 6. The adapter 4 includes a pin-shaped protrusion 8, which is pressed axially into a cavity 9 in the shaft end of the shaft 2 having an end face 10.

FIG. 1b shows a three-dimensional illustration of the shaft 2, with the cavity 9, which is designed as a cylindrical blind hole in the end face 10 of shaft 2.

FIG. 1c shows the disc-shaped adapter 4, with the pin 8, and a wall 12, in which two recesses 11 are also formed. The pin 8 has a slightly larger diameter than the cavity 9 of the shaft (FIG. 1b) to promote a force fit. The recesses 11 are designed to be conical on the illustrated side of the wall 12 (not visible).

FIG. 1d is an alternative perspective of the adapter 4, with the receptacle 6, the wall 12, and the recesses 11. The diameter of the recesses is in this case smaller than the diameter on the opposite side of the wall (see FIG. 1c).

FIG. 1e is a three-dimensional illustration of the magnet sensor 3, which comprises two protrusions 13, which extend from the magnet sensor 3 in the direction parallel to the axis. The protrusions are cylindrical in the region close to the magnet sensor 3 and are expanded conically at the end. As shown here, the magnet sensor 3 does not exist as an individual part but is joined with the adapter by master forming. Master forming or primary shaping means that a part is not manufactured by a cutting process. Master forming means use of a molding or casting process. In the present invention, a joining process is combined with the molding or casting process because one preformed part is inserted into an injection mold of an injection-molding machine. The preformed part does not fill the mold completely so that a cavitation can be filled with the plastic magnet material from the magnet sensor 3. In this case, the magnet sensor 3 and the adapter 4 are joined by a form fit.

The protrusions 13 are not removable. FIG. 1e shows the geometry of the magnet sensor 3, but it is not a preformed part. The adapter 4 is inserted into an injection mold of an injection molding machine. The plastic magnet material is injected into the mold and fills a cavitation. The holes 11 and the reception 6 are parts of this cavitation.

FIG. 2a shows a second embodiment of the magnet sensor assembly 1', with a magnet sensor 3', an adapter 4', a bearing 5', and a shaft 2'. The magnet sensor 3' is accommodated in a receptacle 6' of the adapter and connected to the latter in a form-fit manner (not visible here) using a process similar to that discussed above.

FIG. 2b shows a second embodiment of the shaft 2', which comprises two cavities 9', which extend parallel to each other and to the longitudinal axis of the shaft 2' into the shaft 2'.

FIG. 2c shows a second embodiment of the adapter 4', with two pin-like protrusions 8' and two recesses 11', which are expanded conically and are apertures through a wall 12'. The length of the protrusions 8' is slightly less than the depth of the cavities 9' of the shaft 2' (FIG. 2b).

FIG. 2d shows the adapter 4' alternatively from another perspective, with a receptacle 6' for the magnet sensor, the wall 12', and the recesses 11', which have a smaller cross section here than on the opposite side of the wall (FIG. 2c).

FIG. 2e shows a second embodiment of the magnet sensor 3', which is designed to be cylindrical in its basic form and comprises two protrusions 13', which are expanded cylindrically in the region close to the magnet sensor 3 and conically in the region distant therefrom.

FIG. 3a shows a third embodiment of the magnet sensor means 1", with a shaft 2", an adapter 4", a magnet sensor 3", and a ball bearing 5". In this case, the adapter is pressed onto a section of an outer circumferential region 7" of the shaft 2" and is designed to be pot-shaped in its basic form, wherein a recess 11" exists in the pot-shaped bottom, which recess also forms a receptacle 6" for the magnet sensor. The largest portion of the magnet sensor 3" is however free. From this exposed region of the magnet sensor 3", a protrusion 13" extends axially, which has an expansion at its end in order to establish a form fit with a wall 12" of the adapter 4". Between an end face 10" of the shaft and the magnet sensor 3" is provided a distance 14", which improves the degree of efficiency of the sensor magnetic circuit.

FIG. 3*b* shows a third embodiment of the shaft 2", which does not have any special receptacle geometries for the adapter, which is merely pressed onto the outer circumferential region 7".

FIG. 3*c* shows a third embodiment of the adapter 4", with the recess 11", which is designed to be substantially square in order to act as an anti-rotation element. The adapter is designed to be pot-shaped in its basic form. The radial inner circumferential surface 15" of the pot interacts with the outer circumferential surface 7" (FIGS. 3*a* and 3*b*). The pot bottom forms the wall 12".

FIG. 3*d* shows a third embodiment of the magnet sensor 3", with the protrusion 13", which consists of a substantially square region 16" and a cylindrically expanded region 17". The square region 16" corresponds to the square recess 11" and thus forms an anti-rotation element of the magnet sensor 3" with respect to the adapter 4". With the wall 12" (FIGS. 3*a* and 3*c*), the cylindrically expanded region 17" forms a form fit in the axial direction.

It is to be understood that the present invention is not limited to the illustrated embodiments described herein. Various types and styles of user interfaces may be used in accordance with the present invention without limitation. Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

LIST OF REFERENCE NUMBERS

1 Magnet sensor assembly
2 Shaft
3 Magnet sensor
4 Adapter
5 Ball bearing
6 Receptacle
7 Outer circumferential region
8 Protrusion
9 Cavity
10 End face
11 Recess
12 Wall
13 Protrusion
14 Distance
15 Inner circumferential surface
16 Square region
17 Cylindrical region

What is claimed is:

1. A magnet assembly for use in an electric drive having a shaft with an axial shaft end defining an axial end face, the magnet assembly comprising:
    a permanent magnet with at least two magnetic poles, the permanent magnet being bonded in plastic and having two first protrusions;
    an adapter having two second protrusions and two recesses;
    the axial end face of the shaft having two cavities, each cavity for receiving one of the two second protrusions in order to mount the adapter to the shaft; and
    each one of the two first protrusions of the permanent magnet being received in one of the two recesses in the adapter in order to mount the permanent magnet being bonded in plastic to the adapter.

2. The magnet assembly according to claim 1, wherein the adapter consists of a non-magnetic sintering material.

3. The magnet assembly according to claim 1, wherein each second protrusion has a hexagonal cross section.

4. The magnet sensor assembly according to claim 1, wherein the permanent magnet and the adapter establish a force-fit connection to each other.

5. The magnet sensor device according to claim 1, wherein the permanent magnet consists of duroplast-bonded magnetic particles.

\* \* \* \* \*